United States Patent
Giuntini et al.

(10) Patent No.: US 10,826,381 B2
(45) Date of Patent: Nov. 3, 2020

(54) METHOD AND CONTROL SYSTEM FOR ZERO-SEQUENCE CURRENT COMPENSATION FOR GROUND CURRENT REDUCTION

(71) Applicant: ABB Schweiz AG, Baden (CH)

(72) Inventors: Lorenzo Giuntini, Locarno (CH); Andrea Mannuccini, Locarno (CH)

(73) Assignee: ABB Schweiz AG, Baden (CH)

( * ) Notice: Subject to any disclaimer, the term of this patent is extended or adjusted under 35 U.S.C. 154(b) by 149 days.

(21) Appl. No.: 15/955,154

(22) Filed: Apr. 17, 2018

(65) Prior Publication Data
US 2019/0319530 A1    Oct. 17, 2019

(51) Int. Cl.
*H02M 1/32*    (2007.01)
*H02J 9/06*    (2006.01)
(Continued)

(52) U.S. Cl.
CPC ............... *H02M 1/32* (2013.01); *H02J 9/06* (2013.01); *H02M 5/4585* (2013.01); *H02M 7/48* (2013.01); *H02M 1/12* (2013.01); *H03H 7/0115* (2013.01)

(58) Field of Classification Search
CPC .. H02M 1/12; H02M 1/32; H02M 2001/0012; H02M 5/458; H02M 5/4585;
(Continued)

(56) References Cited

U.S. PATENT DOCUMENTS 5,574,356 A * 11/1996 Parker .................. G05F 1/70
                                                323/207
9,083,261 B2    7/2015 Yang et al.
(Continued)

FOREIGN PATENT DOCUMENTS

EP    2624433 A2    7/2013
EP    2966754 A1    1/2016
(Continued)

OTHER PUBLICATIONS

Papavasiliou et al., "Current control of a Voltage Source Inverter connected to the Grid via LCL Filter", undated, 6 pages, School of Electrical and Computer Engineering, National Technical University of Athens, Greece.
(Continued)

*Primary Examiner* — Rexford N Barnie
*Assistant Examiner* — Jagdeep S Dhillon
(74) *Attorney, Agent, or Firm* — Barnes & Thornburg LLP

(57) ABSTRACT

A control system and methods for a multilevel power converter are provided. The converter includes a rectifier coupled to a DC link having a midpoint coupled to electrical ground that divides the DC link into two halves. The control system is configured to generate a reference current command for controlling an output of the rectifier, the reference current command generated based on a difference between a desired and measured DC link voltage value. The system is also configured to determine a zero-sequence current component of input current supplied to the multilevel power converter, wherein the zero-sequence current component is associated with non-linearities in said multilevel power converter that cause ground current injection into the input current by the rectifier. The system is further configured to subtract the determined zero-sequence current component from the reference current command to reduce the ground current injected into the input current by the rectifier.

18 Claims, 4 Drawing Sheets

(51) Int. Cl.
  *H02M 5/458* (2006.01)
  *H02M 7/48* (2007.01)
  *H03H 7/01* (2006.01)
  *H02M 1/12* (2006.01)

(58) Field of Classification Search
  CPC ....... H02M 2007/53876; H02M 7/537; H02M 7/797; H02M 7/217; H02M 7/48; H02J 9/06; H02P 6/185; H02P 6/187
  USPC ............. 307/52, 43, 38, 64, 66, 80, 82, 109; 363/61, 68, 63
  See application file for complete search history.

(56) References Cited

U.S. PATENT DOCUMENTS

| | | |
|---|---|---|
| 9,735,616 B2 | 8/2017 | Colombi et al. |
| 2013/0163292 A1 | 6/2013 | Basic et al. |
| 2014/0078796 A1* | 3/2014 | Inoue .................. H02M 5/4585 363/68 |
| 2015/0229234 A1* | 8/2015 | Park ........................ H02M 1/12 363/78 |
| 2016/0036216 A1* | 2/2016 | Colombi ................. H02J 9/062 361/93.9 |
| 2016/0329832 A1* | 11/2016 | Aeloiza .................... H02M 1/14 |
| 2017/0099014 A1* | 4/2017 | White .................... H02M 7/537 |
| 2018/0337590 A1* | 11/2018 | He ........................... H02M 1/32 |
| 2019/0190403 A1* | 6/2019 | Furukawa ............... H02M 1/08 |
| 2019/0229643 A1* | 7/2019 | Bax ....................... H02M 7/487 |

FOREIGN PATENT DOCUMENTS

| | | |
|---|---|---|
| EP | 3093977 A1 | 11/2016 |
| KR | 101506010 B1 | 3/2015 |
| WO | 2012013165 A1 | 2/2012 |

OTHER PUBLICATIONS

European Search Report from EP 19 16 9654, dated Sep. 6, 2019, 10 pages.

Jia et al., "Triple line-voltage cascaded Vienna Converter applied as the medium-voltage rectifier", 43rd Annual Conference of the IEEE Industrial Electronics Society, Oct. 29, 2017, pp. 1635-1641.

EPO, Office Action from EP 19169654, dated Jun. 10, 2020, 8 pages.

* cited by examiner

US 10,826,381 B2

METHOD AND CONTROL SYSTEM FOR ZERO-SEQUENCE CURRENT COMPENSATION FOR GROUND CURRENT REDUCTION

BACKGROUND

The field of the invention relates generally to uninterruptible power supplies, and more particularly, to methods and control systems for zero-sequence current compensation for ground current reduction in uninterruptible power supply systems.

A common issue in three-phase, three-level power converters involves the generation of common-mode voltage (CMV). Power converters are inherently unbalanced due to non-transposed distribution lines and unbalanced loads. Additionally, if phases are unequally loaded, they produce undesired negative and zero-sequence components. Zero-sequence current components may cause excessive power losses in the N-line and degrade circuit protection. CMV can manifest as zero-sequence voltage fluctuation relative to ground.

A common arrangement in three-level power converters involves splitting the DC-link into two halves. A known solution to the CMV problem involves connecting the mid-point of the DC-link to mid-points of the input and output AC filters to create a common mid-point, and then connecting it to ground. Bonding the midpoint to ground preserves system grounding and also contains fault currents in a ring architecture to the load-side of the circuit.

However, when the power converter is used in uninterruptible power supply (UPS) applications, standards limit ground current from UPSs to 5% of the maximum input current of the UPS, so any non-linearity injects current on the midpoint of the DC-link. It has been determined that the largest contribution to ground current is from the grid-side power converter. Because the load-side of the DC link has its own protection, only the contribution of ground current from the rectifier needs to be compensated.

BRIEF DESCRIPTION

In one aspect, a control system for a multilevel power converter is provided. The power converter includes a rectifier coupled to a DC link, the DC link including a midpoint coupled to electrical ground that divides the DC link into two halves. The control system includes a processor coupled to a memory device, and is configured to generate a reference current command for controlling an output of the rectifier, the reference current command generated based on a difference between a desired DC link voltage value and a measured DC link voltage value. The system is also configured to determine a zero-sequence current component of input current supplied to the multilevel power converter, wherein the zero-sequence current component is associated with non-linearities in said multilevel power converter that cause ground current injection into the input current by the rectifier. The system is further configured to subtract the determined zero-sequence current component from the reference current command to reduce the ground current injected into the input current by the rectifier.

In another aspect, a method of controlling a multilevel power converter is provided. The power converter includes a rectifier coupled to a DC link, the DC link including a midpoint coupled to electrical ground that divides the DC link into two halves. The method implemented by a processor coupled to a memory device, and includes generating, by the processor, a reference current command for controlling an output of the rectifier, the reference current command generated based on a difference between a desired DC link voltage value and a measured DC link voltage value. The method also includes determining, by the processor, a zero-sequence current component of input current supplied to the multilevel power converter, wherein the zero-sequence current component is associated with non-linearities in said multilevel power converter that cause ground current injection into the input current by the rectifier. The method further includes subtracting, by the processor, the determined zero-sequence current component from the reference current command to reduce the ground current injected into the input current by the rectifier.

DETAILED DESCRIPTION

Figure 1:
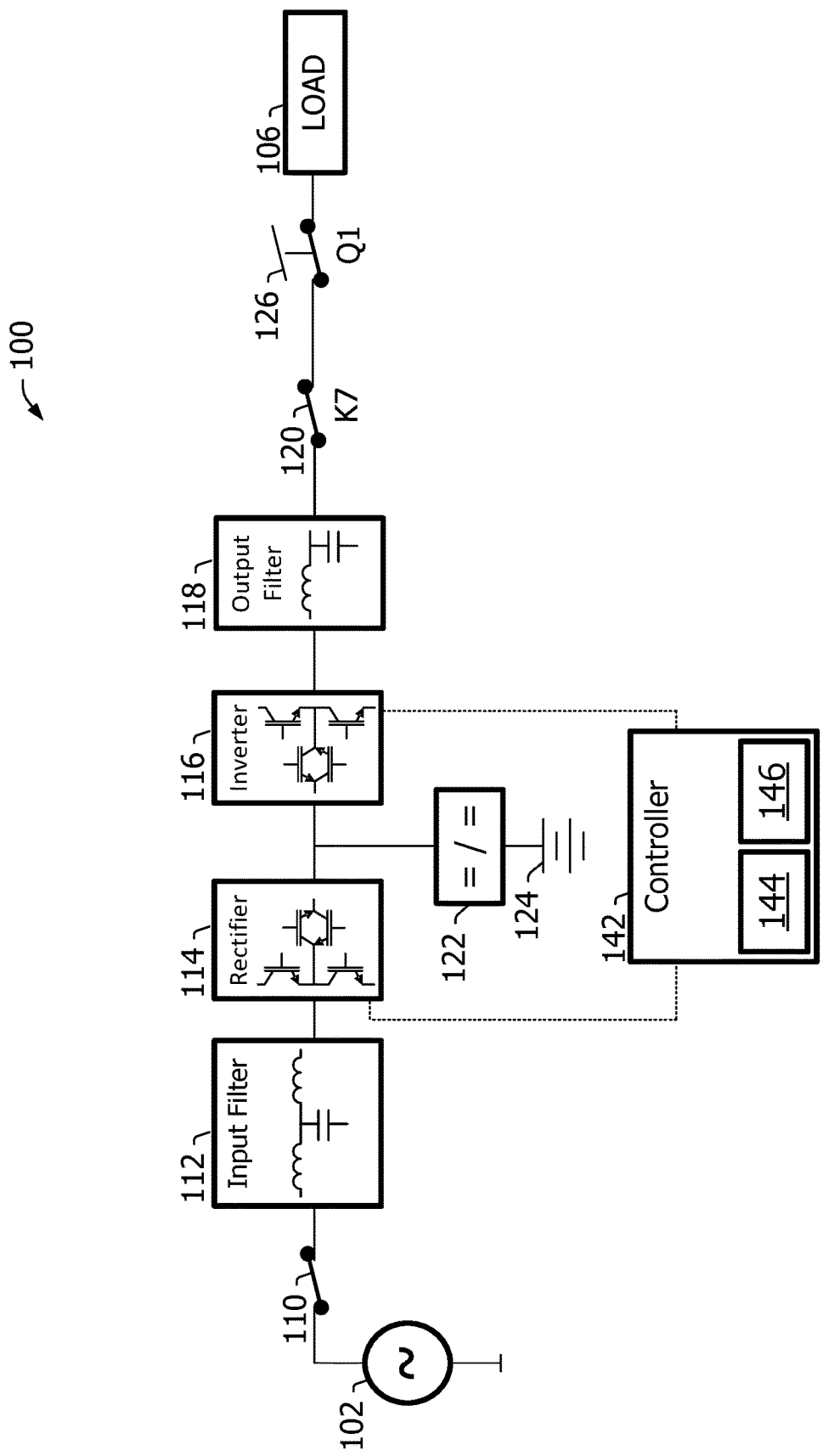
FIG. 1 is a schematic diagram of an exemplary power system that includes a UPS.

FIG. 1 is a schematic diagram of an exemplary power converter 100 that includes a utility 102, an uninterruptible power supply (UPS) 104, and at least one load 106. UPS 104 facilitates delivering power from utility 102 to load 106. In the exemplary embodiment, UPS 104 does not include a transformer (i.e., UPS 104 is transformerless). Alternatively, UPS 104 may include a transformer. In the exemplary embodiment, power converter 100 includes one UPS 104. Alternatively, power converter 100 may include a plurality of multi-mode UPSs 104 coupled in parallel.

As shown in FIG. 1, UPS 104 includes a double-conversion path that includes, in series, a first switch 110, an input filter 112, an alternating current (AC) to direct current (DC) rectifier 114, a DC-AC inverter 116, an output filter 118, and a second switch 120. A DC-DC converter 122 and a battery 124 are coupled in parallel with inverter 116. A third switch 126 facilitates selectively connecting load 106 to UPS 104.

In the exemplary embodiment, rectifier 114 and inverter 116 are three-level converters. Alternatively, rectifier 114 and inverter 116 may be any converters that enable power converter 100 to function as described herein. Because UPS 104 includes rectifier 114 and inverter 116, UPS 104 may also be referred to as a double-conversion UPS.

A control system 142 is communicatively coupled to UPS 104 and controls operation of UPS 104, as described herein. Control system 142 may include its own power system (not shown) such as a dedicated energy source (e.g., a battery). In some embodiments, control system 142 is coupled to a substitute controller (not shown) that may be used in the event that control system 142 fails. Control system 142 may control power distribution and management of power converter 100 over a relatively large geographic area.

In the exemplary embodiment, control system 142 is implemented by a processor 144 communicatively coupled to a memory device 146 for executing instructions. In some embodiments, executable instructions are stored in memory device 146. Alternatively, control system 142 may be implemented using any circuitry that enables control system 142 to control operation of UPS 104 as described herein. For example, control system 142 may determine zero-sequence current components in the input current and compensate for the zero-sequence current components by reducing ground current caused by rectifier 114. Further, control system 142 may dynamically determine what power resources will be needed and at what performance level and environmental conditions (e.g., temperature, humidity, time of day, etc.) those power resources will need to operate. Control system 142 may perform dynamic monitoring to determine whether a load 106 is satisfied with the power delivered, and whether delivered power is free of harmonics, transients, etc. In some embodiments, dynamic monitoring may include tracking resource usage to determine how much current or voltage should be delivered. Control system 142 may also monitor and/or control rapidity (i.e., bandwidth) and inverter capability (e.g., overload, reactive power, active power) to facilitate ensuring reliability of power converter 100 and minimizing performance degradation of UPS 104.

In the exemplary embodiment, control system 142 performs one or more operations described herein by programming processor 144. For example, processor 144 may be programmed by encoding an operation as one or more executable instructions and by providing the executable instructions in memory device 146. Processor 144 may include one or more processing units (e.g., in a multi-core configuration). Further, processor 144 may be implemented using one or more heterogeneous processor systems in which a main processor is present with secondary processors on a single chip. As another illustrative example, processor 144 may be a symmetric multi-processor system containing multiple processors of the same type. Further, processor 144 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein. In the exemplary embodiment, processor 144 causes control system 142 to operate UPS 104, as described herein.

In the exemplary embodiment, memory device 146 is one or more devices that enable information such as executable instructions and/or other data to be stored and retrieved. Memory device 146 may include one or more computer readable media, such as, without limitation, dynamic random access memory (DRAM), static random access memory (SRAM), a solid state disk, and/or a hard disk. Memory device 146 may be configured to store, without limitation, application source code, application object code, source code portions of interest, object code portions of interest, configuration data, execution events and/or any other type of data.

While FIG. 1 depicts power converter 100 in a one-line diagram form, it should be noted that in certain embodiments, the power converter 100 may have multiple phases, such as three phases. For example, the output AC power provided to load 106 may include any number of phases (e.g., u1, u2, u3). As such, any reference made herein to a current or a voltage in one phase is intended to be a reference to the current and voltage of each phase.

Figure 2:
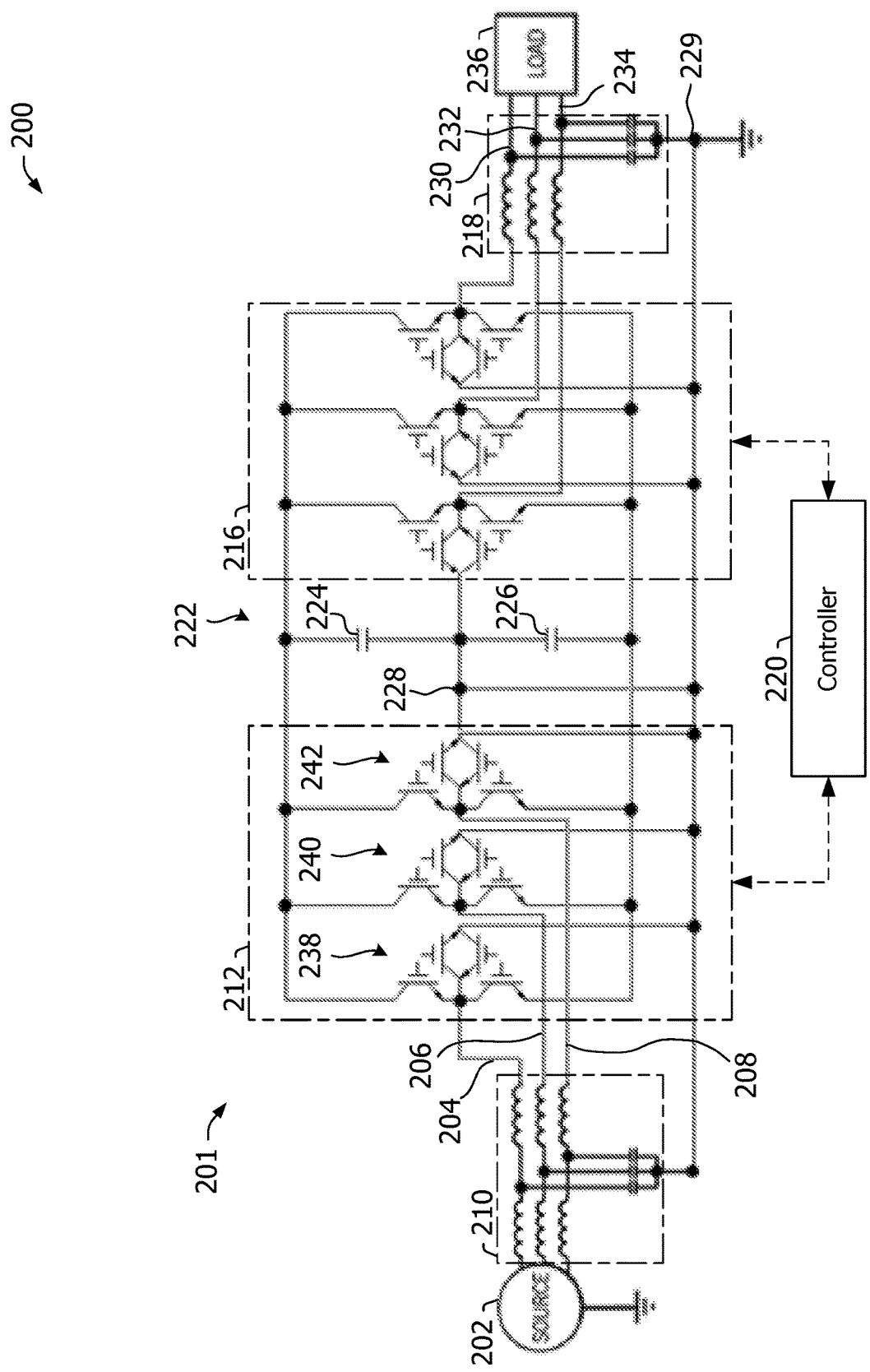
FIG. 2 is a circuit diagram of an exemplary power system that includes a UPS.

FIG. 2 is a circuit diagram of an exemplary power system 200 that includes a UPS 201. In one embodiment, UPS 201 is similar to UPS 104 (shown in FIG. 1). In an exemplary embodiment, UPS 201 is coupled to an AC input source 202 that supplies three-phase power via lines 204, 206, and 208. AC input source 202 may represent, for example, utility power from an electrical grid or a local or remote generator. UPS 201 includes an input filter 210, a rectifier 212, an inverter 216, an output filter 218, and a controller 220.

In an exemplary embodiment, UPS 201 is a double-conversion transformerless UPS and rectifier 212 and inverter 216 each include three-level T-type neutral-point-clamped (NPC) converters. Controller 220 controls operation of rectifier 212 such that rectifier 212 provides DC power to inverter 216. Rectifier 212 converts the three-phase AC power from AC input source 202 into DC power on a DC link 222.

In an exemplary embodiment, DC link 222 is a split DC link and includes an upper capacitor 224 and a lower capacitor 226. Upper and lower capacitors 224 and 226 are coupled between positive and negative terminals of DC link 222 and filter residual AC components of the DC power on DC link 222. A midpoint 228 between upper and lower capacitors 224 and 226 is bonded to a mid-point of input filter 210 and output filter 218, all of which are connected to ground 229.

In an exemplary embodiment, controller 220 is substantially similar to control system 142 (shown in FIG. 1) and controls operation of rectifier 212 using a processor operably coupled to memory and/or storage. Controller 220 controls how rectifier 212 converts the AC power from AC input source 202 into DC power for DC link 222 by sending switching signals to a number of switches, for example, Insulated Gate Bipolar Transistors (IGBT), included within rectifier 212. In this manner, controller 220 controls the amount of current passing through each of a first leg 238, a second leg 240, and a third leg 242 of rectifier 212, which in turn, controls the amount of current drawn from each phase of AC input source 202 on lines 204, 206, and 208.

As described above, bonding the midpoint 228 of split-capacitor DC link 222 to ground preserves system grounding as well as contains fault currents in a ring architecture to the load-side of the circuit. Standards limit ground current from UPSs to 5% of the maximum input current of the UPS, so any non-linearity injects current on the midpoint 228. It has been determined that the largest contribution to ground current is from rectifier 212. Because the load-side of DC link 222 has its own protection, only the contribution of ground current from rectifier 212 needs to be compensated.

Rectifier 212 attempts to combine three-phases of input current that are 120° apart, but non-linearities in the current introduce distortion that contributes to ground current injection caused by rectifier 212. When midpoint 228 is coupled to ground 229, rectifier 212 may cause ground current to flow into the ground conductor of ground 229, resulting in a ground fault from midpoint 228 to ground 229. To compensate for the ground current caused by rectifier 212, controller 220 determines a zero-sequence current component of input AC current and compensates for the zero-sequence current component to reduce ground current caused by rectifier 212, as described in more detail herein. The zero-sequence current component is one of the three symmetrical components used to study systems under unbalanced conditions. The zero-sequence current component corresponds to a neutral current value of three input current phasors of the input current. Thus, the zero-sequence current component is directly associated with ground faults.

Figure 3:
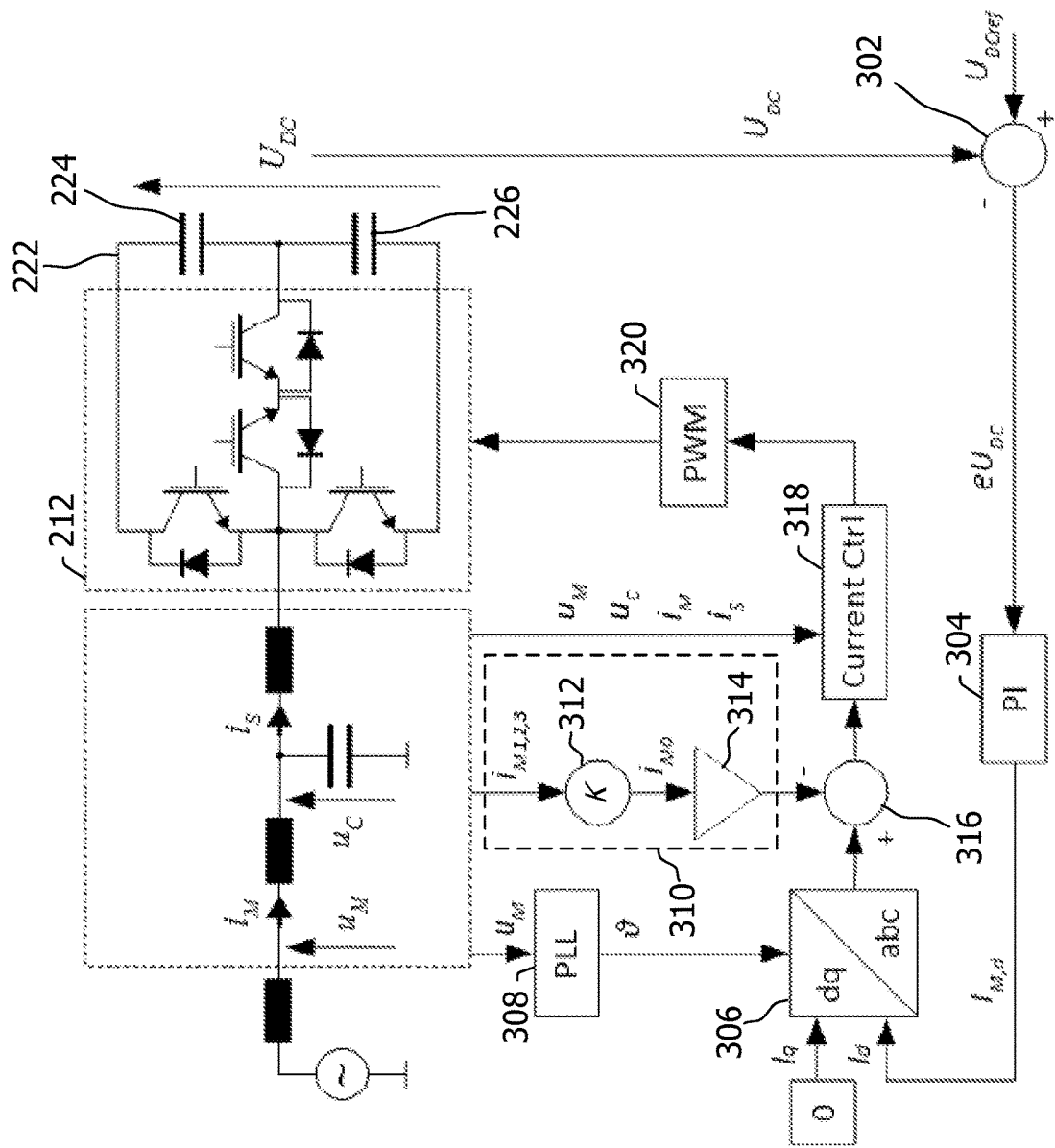
FIG. 3 is a block diagram of a current control algorithm for providing zero-sequence current compensation for ground current reduction in the UPS shown in FIG. 2.

FIG. 3 is a block diagram of a current control algorithm 300 that provides zero-sequence current compensation for ground current reduction in UPS 201 (shown in FIG. 2). Current control algorithm 300 may be executed using, for example, controller 220 (shown in FIG. 2). The algorithm is shown as being applied to one leg of rectifier 212 (shown in FIG. 2); however, it may be identically applied to the other two legs of rectifier 212 and so the description will not be repeated herein.

As shown in FIG. 3, a reference current command signal is generated for controlling an output of rectifier 212. The reference current command signal is based on a difference between a desired DC link voltage and a measured DC link voltage value Udc. Specifically, measured DC link voltage value Udc is subtracted from a reference DC link voltage value $Udc_{ref}$ at summation block 302 to determine an error DC link voltage value eUdc. The DC link voltage value is measured at DC link 222. The reference DC link voltage value $Udc_{ref}$ represents a desired DC link voltage value at DC link 222 The error DC link voltage value eUdc is inputted into a PI controller 304, which generates a d-domain reference current command signal $I_d$. D-domain reference current command signal $I_d$ is inputted into a d-q to a-b-c domain transformation block 306 along with a q-domain reference current command signal $I_q$ of 0 and an output from a phase locked loop block 308 based on input voltage. The d-q to a-b-c domain transformation block 306 generates reference current command signals $I^*_{a,b,c}$.

Prior to being applied to rectifier 212, the reference current command signals $I_{a,b,c}$ are adjusted by a zero-sequence compensation block 310 to compensate for zero-sequence current components. Ground current caused by non-linearities in power system 200 is injected by rectifier 212 onto the AC input current. The ground current is computed as the zero-sequence of AC input current from AC source 202. To determine the injected ground current, a summation block 312 determines the zero-sequence current component, which is a sum of the line currents $I_m$ that are already normally measured by controller 220 for control of rectifier 212 using, for example, a current sensor. A gain k is added to the zero-sequence current component $i_{M0}$ at gain block 314. Gain k may be determined as a function of the sum of the line currents $I_m$, while factoring in performance and stability considerations.

The output of gain block 314 is a zero-sequence compensation reference current signal $I_{ZS\_ref}$. The zero-sequence compensation reference current signal $I_{ZS\_ref}$ is subtracted from reference current command signals at a summation block 316 to mitigate ground current distortion and reduce ground current caused by rectifier 212. Compensated reference current command signals $I_{a,b,c}$ are provided to a current controller 318 and then to a PWM controller 320 for controlling rectifier 212.

In an alternative embodiment, analog control may be used to alter the current reference. A summing amplifier would compute the zero-sequence current component, which is then fed to a differential amplifier to alter the current reference.

Figure 4:
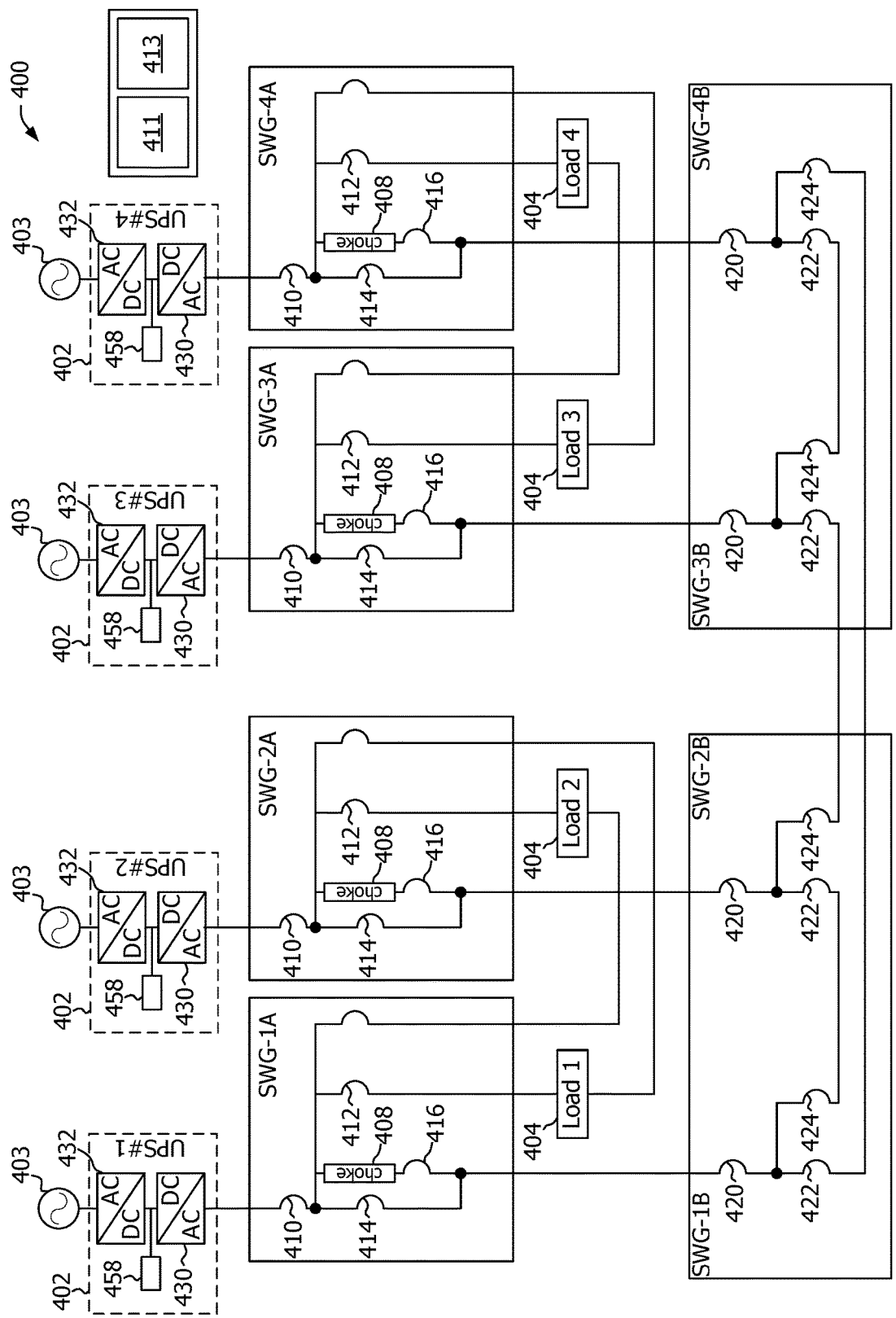
FIG. 4 is a circuit diagram of an exemplary ring bus architecture.

FIG. 4 is a schematic diagram of an exemplary redundant isolated-parallel (IP) uninterruptible power supply (UPS) ring bus architecture 400 in which current control algorithm 300 (shown in FIG. 3) may be used. In the exemplary embodiment, architecture 400 includes a plurality of UPSs 402 arranged in a ring architecture, or parallel architecture, as described herein. Specifically, architecture 400 includes four UPSs 402 in the exemplary embodiment. Alternatively, architecture 400 may include any number of UPSs 402 that enable architecture 400 to function as described herein. In the exemplary embodiment, architecture 400 is a three wire system. Alternatively, architecture 400 may be a four wire system (typically to supply loads that require a neutral wire).

In the exemplary embodiment, UPSs 402 are static double conversion UPSs (i.e., true on-line system systems). Both static and rotary UPSs may require droop control techniques for both voltage and frequency. In some cases, droop control for frequency alone may be sufficient. In some embodiments, droop control techniques are modified in order to handle non-linear loads.

Architecture 400 facilitates providing power to one or more loads 404. Under normal operation, one or more utilities function as a voltage source 403 and provide alternating current (AC) power to loads 404. Generators may also function as voltage sources 403. Notably, voltage sources 403 do not need to be synchronized in architecture 400. This is advantageous, as every UPS 402 may be fed by an individual generator and/or utility, and there is no need to add additional equipment to synchronize voltage sources 403.

In the event of a failure of voltage source 403 or of the UPS rectifier, UPS 402 utilizes energy storage systems 458 (e.g., batteries, flywheels, etc. with their converter) connected to UPSs 402 to keep power flowing to loads 404, as described herein. Further, if a given UPS 402 fails, loads 404 receive power through a ring bus 406, as described herein. In the exemplary embodiment, architecture 400 includes four loads 404. Alternatively, architecture 400 may include any suitable number of loads 404 that enable architecture 400 to function as described herein.

In the exemplary embodiment, each UPS 402 is electrically coupled to an associated load 404, and coupled to ring bus 406 through an associated choke 408 (e.g., an inductor). In architecture 400, without proper synchronization, UPSs 402 cannot work properly due to undesirable circulation currents. Accordingly, in the exemplary embodiment, at least one controller 409 controls operation of UPSs 402. More specifically, at least one controller 409 controls a frequency of an output voltage of each UPS 402, as described herein. The frequency for each UPS 402 is calculated as a function of power, as described herein.

In some embodiments, architecture 400 includes a separate, dedicated controller 409 for each UPS 402. Alternatively, system may include a single controller 409 that controls operation of all UPSs 402. Each controller 409 may include its own power system (not shown) such as a dedicated energy source (e.g., a battery). In some embodiments, each controller 409 is coupled to a substitute controller (not shown) that may be used in the event that controller 409 fails.

In the exemplary embodiment, each controller 409 is implemented by a processor 411 communicatively coupled to a memory device 413 for executing instructions. In some embodiments, executable instructions are stored in memory device 413. Alternatively, controller 409 may be implemented using any circuitry that enables controller 409 to control operation of UPSs 402 as described herein. For example, in some embodiments, controller 409 may include a state machine that learns or is pre-programmed to determine information relevant to which loads 404 require power.

In the exemplary embodiment, controller 409 performs one or more operations described herein by programming processor 411. For example, processor 411 may be programmed by encoding an operation as one or more executable instructions and by providing the executable instructions in memory device 413. Processor 411 may include one or more processing units (e.g., in a multi-core configuration). Further, processor 411 may be implemented using one or more heterogeneous processor systems in which a main processor is present with secondary processors on a single chip. As another illustrative example, processor 411 may be a symmetric multi-processor system containing multiple processors of the same type. Further, processor 411 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein. In the exemplary embodiment, processor 411 causes controller 409 to operate UPSs 402, as described herein.

In the exemplary embodiment, memory device 413 is one or more devices that enable information such as executable instructions and/or other data to be stored and retrieved. Memory device 413 may include one or more computer readable media, such as, without limitation, dynamic random access memory (DRAM), static random access memory (SRAM), a solid state disk, and/or a hard disk. Memory device 413 may be configured to store, without limitation, application source code, application object code, source code portions of interest, object code portions of interest, configuration data, execution events and/or any other type of data.

In the exemplary embodiment, as described in more detail below, one or more controllers 409, and more specifically processor 411, calculates an output voltage frequency for each UPS 402, and one or more controllers 409 operate each UPS 402 at the calculated frequency. Operating each UPS 402 at their respective calculated frequencies as determined by the droop controls makes it possible to achieve load sharing and stability in architecture 400. The frequencies of operation across the various UPSs 402 are different in transient conditions (e.g., following a variation of one or more loads 404). Once the droop controls are in steady state, all UPSs 402 operate at the same frequency but with a phase shift across chokes 408 that equalizes the active power provided by each UPS 402.

In architecture 400, each UPS 402 is able to supply power to an associated local load 404, as well as transfer active and reactive power to ring bus 406 through an associated choke 408. In the exemplary embodiment, architecture 400 facilitates sharing local loads 404 equally between UPSs 402 without any communication using droop controls, and in particular, frequency versus active power and voltage versus reactive power. This removes limitations on the number of UPSs 402 in architecture 400.

In the exemplary embodiment, architecture 400 includes a number of switching devices. Specifically, for each UPS 402, a first switching device 410 is electrically coupled between UPS 402 and choke 408, a second switching device 412 is electrically coupled between first switching device 410 and local load 404, a third switching device 414 is electrically coupled between first switching device 410 and ring bus 406, and a fourth switching device 416 is coupled between choke 408 and ring bus 406. Further, at ring bus 406, a central switching device 420, a left switching device 422, and a right switching device 424 are associated with each UPS 402, and facilitate isolating UPS 402 from ring bus 406 and/or other UPSs 402 on ring bus 406. Each switching device 410, 412, 414, 416, 420, 422, and 424 may include associated logic and relays (neither shown) for operation. The protection scheme provided by switching devices 410, 412, 414, 416, 420, 422, and 424 facilitates locating faults in architecture 400 and isolating those faults by opening the appropriate devices. Further, third switching devices 414, also referred to as bypass breakers, facilitate bypassing choke 408 when the associated UPS 402 fails or is under maintenance. This facilitates improving the quality of the voltage on the associated local load 404 as the voltage drop on choke 408 is removed. In the exemplary embodiment, at least one controller 409 detects a fault condition within architecture and controls one or more switching devices 410, 412, 414, 416, 420, 422, and 424 to address the fault condition. As used herein, a 'fault condition' refers to any scenario in which one or more switching devices 410, 412, 414, 416, 420, 422, and 424 should be switched (i.e., opened or closed) to facilitate operation of architecture 400. Accordingly, addressing a 'fault condition' includes bypassing choke 408 when the associated UPS 402 fails or is under maintenance.

Current control algorithm 300 provides zero-sequence current compensation for ground current reduction in UPSs 402. As described above, bonding the midpoint 228 of split-capacitor DC link 222 to ground preserves system grounding as well as contains fault currents in a ring architecture to the load-side of the circuit. Standards limit ground current from UPSs to 5% of the maximum input current of the UPS, so any non-linearity injects current on the midpoint 228.

It has been determined that the largest contribution to ground current is from rectifier 212. Because the load-side of DC link 222 has its own protection, only the contribution of ground current from rectifier 212 needs to be compensated. Controller 220 compensates for the zero-sequence current components by reducing ground current caused by rectifier 212.

Exemplary embodiments of systems and methods for uninterruptible power supplies are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

At least one technical effect of the systems and methods described herein includes (a) generating a reference current command for controlling the rectifier; (b) determining a zero-sequence current component of input current supplied to the multilevel power converter; and (c) compensating the reference current command with the determined zero-sequence current component to reduce ground current injected by the rectifier.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A control system for a multilevel power converter having a rectifier coupled to a direct current (DC) link, the DC link including a midpoint coupled to electrical ground that divides the DC link into two halves, said control system comprising a processor coupled to a memory device, said control system configured to:
generate a reference current command for controlling an output of the rectifier, the reference current command generated based on a difference between a desired DC link voltage value and a measured DC link voltage value;
implement at least one of proportional-integral (PI) control, deadbeat control, repetitive control, and periodic control to determine a zero-sequence current component of input current supplied to the multilevel power converter,
wherein the zero-sequence current component is associated with non-linearities in the multilevel power converter that cause ground current injection into the input current by the rectifier; and
subtract the determined zero-sequence current component from the reference current command to reduce the ground current injected into the input current by the rectifier.

2. A control system in accordance with claim 1, wherein to determine the zero-sequence current component of input current, said control system is configured to: sum a plurality of line currents that form the input current; and add a gain to the summed plurality of line currents.

3. A control system in accordance with claim 1, wherein the zero-sequence current component represents a neutral current value of three input current phasors of the input current.

4. A control system in accordance with claim 1, wherein to subtract the determined zero-sequence current component from the reference current command, said control system is configured to mitigate ground current distortion in the power converter.

5. A control system in accordance with claim 1, wherein the determined zero-sequence current component directly correlates to the ground current injected by the rectifier.

6. A control system in accordance with claim 1, wherein said control system is configured to reduce ground current injected by a three-phase, three-level rectifier.

7. A control system in accordance with claim 1, wherein said control system is operable to control a T-type neutral-point-clamped (NPC) converter.

8. A control system in accordance with claim 1, wherein said control system is operable to control an uninterruptible power supply (UPS).

9. A control system in accordance with claim 8, wherein said control system is configured to limit the injected ground current to within 5% of a maximum input current of the UPS.

10. A control system in accordance with claim 8, wherein a plurality of UPSs are coupled between a power source and a ring bus, and wherein said control system is coupled to at least one of the plurality of UPSs.

11. A control system in accordance with claim 1, wherein to determine the zero-sequence current component, said control system is configured to one of compute the zero-sequence current component as part of transformation to symmetric components and apply Clarke/Park transformation to three-phase current quantities.

12. A method of controlling a multilevel power converter having a rectifier coupled to a DC link, the DC link including a midpoint coupled to electrical ground that divides the DC link into two halves, said method implemented by a processor coupled to a memory device, said method comprising:
generating, by the processor, a reference current command for controlling an output of the rectifier, the reference current command generated based on a difference between a desired DC link voltage value and a measured DC link voltage value; determining, by the processor, a zero-sequence current component of input current supplied to the multilevel power converter, wherein the zero-sequence current component is associated with non-linearities in said multilevel power converter that cause ground current injection into the input current by the rectifier, and wherein determining the zero-sequence current component of input current comprises implementing at least one of proportional-integral (PI) control, deadbeat control, repetitive control, and periodic control; and subtracting, by the processor, the determined zero-sequence current component from the reference current command to reduce the ground current injected into the input current by the rectifier.

13. A method in accordance with claim 12, wherein determining the zero-sequence current component of input current further comprises: summing a plurality of line currents that form the input current; and adding a gain to the summed plurality of line currents.

14. A method in accordance with claim 12, wherein subtracting the determined zero-sequence current component from the reference current command further comprises mitigating ground current distortion in the power converter.

15. A method in accordance with claim 12, wherein adjusting the reference current command further comprises reducing ground current injected by a three-phase, three-level rectifier.

16. A method in accordance with claim 12, further comprising limiting the injected ground current to within 5% of a maximum input current of an uninterruptible power supply (UPS).

17. A method in accordance with claim 12, wherein the power converter is in an uninterruptible power supply (UPS), and wherein a plurality of UPSs are coupled between a power source and a ring bus, said method further comprises adjusting the reference current commands of at least one of the plurality of UPSs.

18. A method in accordance with claim 12, wherein determining the zero-sequence current component of input current further comprises one of computing the zero-sequence current component as part of transformation to symmetric components and applying Clarke/Park transformation to three-phase current quantities.

* * * * *